(12) United States Patent
Kelley

(10) Patent No.: US 7,119,588 B2
(45) Date of Patent: Oct. 10, 2006

(54) CIRCUIT FOR MULTIPLYING CONTINUOUSLY VARYING SIGNALS

(76) Inventor: James Wayne Kelley, P.O. Box 682, Silverado, CA (US) 92676

( * ) Notice: Subject to any disclaimer, the term of this patent is extended or adjusted under 35 U.S.C. 154(b) by 0 days.

(21) Appl. No.: 11/044,307

(22) Filed: Jan. 28, 2005

(65) Prior Publication Data

US 2006/0170465 A1    Aug. 3, 2006

(51) Int. Cl.
*H03B 19/00* (2006.01)
(52) U.S. Cl. ................. 327/116; 327/122
(58) Field of Classification Search ........... 327/113, 327/116, 119, 122
See application file for complete search history.

(56) References Cited

U.S. PATENT DOCUMENTS

| 4,019,118 A | 4/1977 | Harwood |
| 4,144,581 A | 3/1979 | Prudente |
| 4,325,076 A | 4/1982 | Harwood |
| 4,398,153 A | 8/1983 | Rittenbach |
| 4,532,604 A | 7/1985 | Baker |
| 4,542,353 A | 9/1985 | Sexton |
| 5,097,218 A | 3/1992 | Cooper |
| 5,105,446 A * | 4/1992 | Ravoalavoson et al. .... 375/296 |
| 5,132,636 A * | 7/1992 | Hori .......................... 327/129 |
| 5,235,406 A | 8/1993 | Ishii |
| 5,528,227 A | 6/1996 | Eguchi |
| 6,111,960 A | 8/2000 | Aarts |
| 6,295,547 B1 | 9/2001 | Zhang |
| 6,304,997 B1 | 10/2001 | Huber |

* cited by examiner

Primary Examiner—Dinh T. Le
(74) Attorney, Agent, or Firm—James W. Kelley

(57) ABSTRACT

A means for obtaining an output signal which is the sum of the frequencies of two periodic input signals that may vary in amplitude and frequency over time. The apparatus, which provides means for realizing trigonometric functions of the form $\sin(\alpha+\beta)=2\sin\alpha\cos\beta-\sin(\alpha-\beta)$ or $\sin n\alpha = 2\sin(n-1)\alpha\cos\alpha - \sin(n-2)\alpha$, comprises three basic circuit elements including one or more analog multipliers, one or more envelope detectors, and a subtracter. A method is disclosed for generating a series of even and odd harmonics of a single continuously varying input signal using a plurality of cascaded harmonic generator circuits.

13 Claims, 4 Drawing Sheets

CIRCUIT FOR MULTIPLYING CONTINUOUSLY VARYING SIGNALS

BACKGROUND OF THE INVENTION

The invention disclosed herein relates to active electrical non-linear circuits in general, and to analog frequency multipliers in particular. A variety of methods common in the art utilize a multiplying or modulating device in order to obtain the product of two or more time varying signals. This product contains both the sum and the difference of the input frequencies, commonly known as sidebands. In the field of audio signal processing, these sidebands are typified as harmonics or partials wherein the upper sideband is a multiple of an input frequency. In radio circuits, frequency selective filter circuits are typically employed to eliminate the unwanted sideband. It is usually desirable to drive the multiplying device with two signals that are in phase quadrature, thus necessitating the use of additional frequency selective phase shifting circuitry. Both of these practices necessarily limit the usable bandwidth of the circuit, and become a source of error as frequency approaches the skirts of the passband. Furthermore, most commonly employed frequency multiplication means are not well suited to applications in which the input signal amplitude varies to any significant degree. Means have been proposed in the prior art to accommodate variations in amplitude by normalizing the amplitude of the input signal, using dynamic compression for example, prior to multiplication. This method proves to be problematic for signal processing applications in which it is necessary to respond to and reproduce the dynamic range of the input signal. A further issue is in regard to a DC offset voltage that may be generated in the multiplication process. Typically, a coupling capacitor or high pass filter is employed at the output of the multiplier for the purpose of blocking the DC voltage. However, this adds the further complication of attenuating low frequencies and slowing circuit response to rapid changes in signal amplitude.

Means for generating a series of harmonics are also common in the related art. Most common among these are circuits which impress limits on the amplitude of a sinusoidal signal by way of clipping. Methods for generating even order harmonic distortion often employ half-wave or full-wave rectification of an input signal. Control of the amplitude of the harmonic products relative to the amplitude of the fundamental input signal is most commonly effected by changing the gain of the input signal while maintaining a fixed amplitude limit, or by changing the limit relative to the amplitude of the input signal. However, the relative amplitudes of each of the frequency domain formants which comprise the distorted waveform reside in fixed ratios that are predetermined by the nature and construction of the distorting circuit. The amplitudes of these formants are not individually adjustable over any broad span of frequencies in the analog domain. Changes in the relative balance of harmonics generated in this fashion can only be effected as a function of frequency, by frequency selective filter circuits. The constraining consequence of this technique is the lack of control over harmonic response independent of frequency response.

The various means recited in the prior art each exhibit one or more of the difficulties as described above. It is apparent in the detailed descriptions and accompanying figures which follow that the present invention circumvents each of these difficulties, and provides significantly simpler means that are distinct from and not reliant upon, the means revealed in the prior art.

BRIEF SUMMARY OF THE INVENTION

The present invention provides a versatile analog means for producing the sum of sinusoidal and cosinusoidal input frequencies by taking the product of the two input signals, creating the lower sideband by separate means, and subtracting said lower sideband from the product of the two input signals. An aspect of the present invention allows the signal multiplying apparatus to operate over a wide range of input amplitudes and frequencies. The principal advantage of the present method over prior art methods is the simplicity of the circuit. The circuit arrangement comprises three basic types of circuit elements, including one or more multipliers, one or more envelope detectors each comprising a precision rectifier and low pass filter, and a subtracter circuit. In one embodiment, a means for generating a harmonic series is disclosed. One facet of the present invention provides a wide bandwidth analog circuit arrangement for generating harmonic or inharmonic multiples of a highly dynamic continuously varying input signal. Another facet of the invention furnishes a circuit arrangement for producing a series of harmonics, each with a unique harmonic generating circuit, in order that each harmonic in the series can be processed and balanced individually. Obtaining such control affords control of the shape of the wave which is formed by combining the input waveform with the harmonics generated by the invention specified herein.

In a general embodiment of the invention, an input multiplier with a relative gain of two finds the product of two input signals, a $\sin(A)$ and b $\cos(B)$, thus producing ab $\sin(A+B)+ab \sin(A-B)$. Envelope detectors continuously evaluate the instantaneous peak magnitude of each of the two input signals a and b, and a second multiplier finds the product of the two peak magnitudes, ab. That product, and a third input signal $\sin(A-B)$, are each applied to the respective inputs of a third multiplier which then evaluates the product ab $\sin(A-B)$. That resultant is applied to the inverting input of a subtracter circuit, while the output from the input multiplier is applied to the non-inverting input of the same subtracter circuit. The subtracter circuit thus evaluates the expression $$ab \sin(A+B) + ab \sin(A-B) - (ab \sin(A-B)) = ab \sin(A+B).$$

Significant simplification of the circuit, as detailed in one embodiment of the invention, can be enjoyed when a plurality of similar such circuits are used in sequential combination. For example, when a frequency doubler circuit is assembled according to the present invention, the resulting cosine function is conveniently used as an input signal for higher order harmonics generator circuits, thus obviating the need for frequency selective phase shifting circuitry. Further circuit simplification is possible when the difference in frequency between two input multiplicands A and B, is equal to one of the input frequencies as in A−B=B, or when the difference between two multiplicands C and B, is equal to the fundamental input frequency A, as in C−B=A.

Embodiments of the invention using as few as three circuit elements including one multiplier, one envelope detector, and one subtracter are described. The use of envelope detectors in conjunction with multipliers to continuously evaluate the magnitude of a lower sideband product in exact proportion to its production in the input multiplier enables the disclosed apparatus to precisely track input signals and thus facilitates the accurate generation of harmonics over a large dynamic range of input signals. The absence of frequency selective circuits in the AC signal path provides a usable circuit bandwidth which is constrained only by the bandwidth accuracy of the multiplying devices. Embodiments of the invention may be assembled from as few as two integrated circuit chips including a multiplier and a quad op amp.

DETAILED DESCRIPTION OF THE INVENTION

Disclosed herein is an approach for producing a sinusoidal waveform having a frequency that is the sum of two input frequencies, is absent a signal representing the difference between those two frequencies, and which is accurate and responsive over a wide range of frequencies and amplitudes. The trigonometric formulas from which the apparatus described herein is derived are as follows:

$$\sin \alpha \cos \beta = \frac{1}{2}\sin(\alpha+\beta) + \frac{1}{2}\sin(\alpha-\beta), \text{ and } -\cos \alpha \sin \beta = -\frac{1}{2}\sin(\alpha+\beta) + \frac{1}{2}\sin(\alpha-\beta).$$

Rewriting the formulas for this application yields $\sin(\alpha+\beta) = 2 \sin \alpha \cos \beta - \sin(\alpha-\beta)$ and $-\sin(\alpha+\beta) = -2 \cos \alpha \sin \beta - \sin(\alpha-\beta)$ respectively. It is also noted that the apparatus may be utilized to realize the trigonometric identity $\sin n\alpha = 2 \sin(n-1)\alpha \cos \alpha - \sin(n-2)\alpha$.

Figure 1:
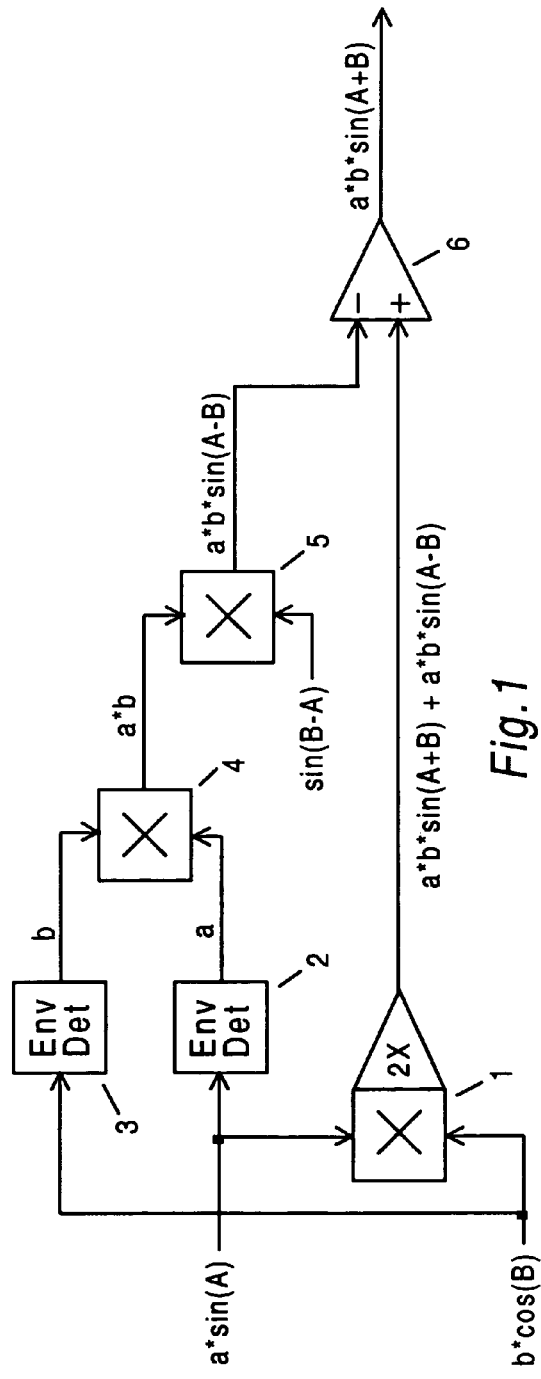
FIG. 1 shows a means for generating sin(A+B) from three input signals; sin(A), cos(B), and sin(A−B) respectively.

FIG. 1 shows a circuit for providing dynamic response to input signals of varying amplitude by using envelope detectors to produce a signal in direct amplitude proportion to that of the lower sideband generated by input multiplier 1. Two input signals, a sin (A) and b cos (B) are applied to the respective inputs of multiplier 1. The resultant of this multiplication is scaled by a factor of two, and can thus be represented as ab sin(A+B)+ab sin (A−B). The same two said input signals are applied respectively to the inputs of envelope detectors 2 and 3. An envelope detector such as those shown in these figures can be of any construction common in the art, as for example the series combination of a precision rectifier followed by a second order Sallen-Key low pass filter. The time constant of the filter is nominally chosen for the fastest possible response and minimum practicable passband. Envelope detector 2 produces at its output a DC voltage a, representative of the magnitude of input signal a sin(A). Envelope detector 3 produces at its output a DC voltage b, representative of the magnitude of input signal b cos (B). Output signals from envelope detectors 2 and 3 are applied to the respective inputs of multiplier 4. Multiplier 4 thus produces at its output a DC voltage ab, which is thus the product of the magnitudes of input signals a sin (A) and b cos (B). The DC voltage ab is applied to the first input of multiplier 5, and a third input signal sin (A−B) is applied to the second input of multiplier 5. The output of multiplier 5 thus produces the signal ab sin (A−B). It can be seen that the sinusoidal signal produced at the output of multiplier 5 exactly replicates the lower sideband signal produced by multiplier 1. Said output signal from multiplier 5 is applied to the inverting input of subtracter 6, and the output signal from multiplier 1 is applied to the non-inverting input of subtracter 6 thus providing the signal ab sin(A+B). It can thus be seen that for any two frequencies A and B, at any respective magnitudes a and b, a third frequency equal to A+B at a magnitude of ab is generated. By way of practical concerns, the product ab can quickly become very large, and so commercially available multiplier chips such as the AD633 which divide the output by a factor of 10 recommend themselves.

Figure 2:
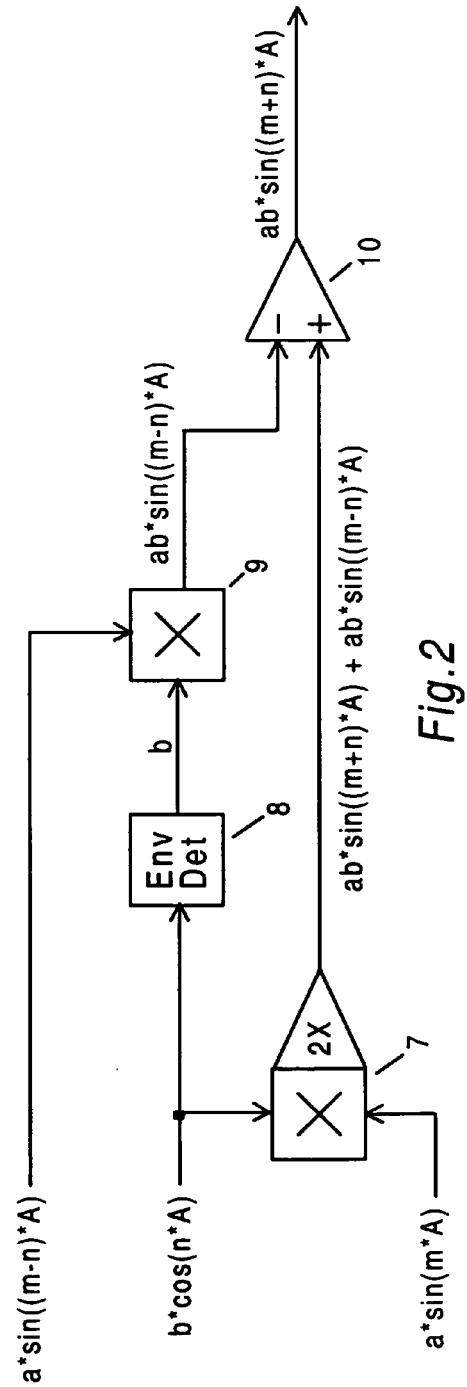
FIG. 2 shows a means for generating sin((m+n)A) from three input signals; cos(nA), sin(mA), and sin((m−n)A) respectively.

FIG. 2 illustrates a simplified frequency multiplier circuit which, according to aspects of the present invention, can be used when sinusoidal and cosinusoidal input signals a sin (m·A) and b cos (n·A) respectively, are each a multiple m, n ≧ 1 of the frequency of a fundamental input signal a sin(A). In FIG. 2 sinusoidal input signal a sin(m·A) is applied to a first input of multiplier 7. Cosinusoidal input signal b cos (n·A) is applied to a second input of multiplier 7 and also to the input of envelope detector 8. Multiplier 7 evaluates the product of same said two input signals increased in relative amplitude by a factor of two, thus producing the resultant ab sin((m+n)·A)+ab sin((m−n)·A). Envelope detector 8 evaluates the magnitude of said input signal and produces at its output a DC voltage b. The resultant voltage b is presented to a first input of multiplier 9. A third input signal a sin((m−n)·A) is applied to a second input of multiplier 9. Multiplier 9 evaluates the product of said signals presented at its inputs and produces as a resultant, a waveform represented by the expression ab sin((m−n)·A). This signal is applied to the inverting input of subtracter 10. The signal from the output of multiplier 7 is applied to the non-inverting input of subtracter 10 which accordingly provides the resultant ab sin((m+n)·A). The given circuit arrangement thereby effectively produces a signal which is (m+n) times a fundamental frequency for any given set of input amplitudes, provided such amplitudes do not exceed the voltage limitations presented by the active devices.

It should be noted with regard to the preceding discussion that any modulations impressed upon one input signal with respect to any other input signal will also appear as a term or terms in the output signal.

Also worthy of note is the fact that the gain factor of two which is impressed upon the signal appearing at the non-inverting input of the subtracter is significant only in that the gain of the circuit which produced said signal is a factor of two greater than the gain impressed upon the signal appearing at the inverting input of the subtracter. Attenuating the latter signal by half and leaving the former at unity gain is an equivalent approach.

Figure 3:
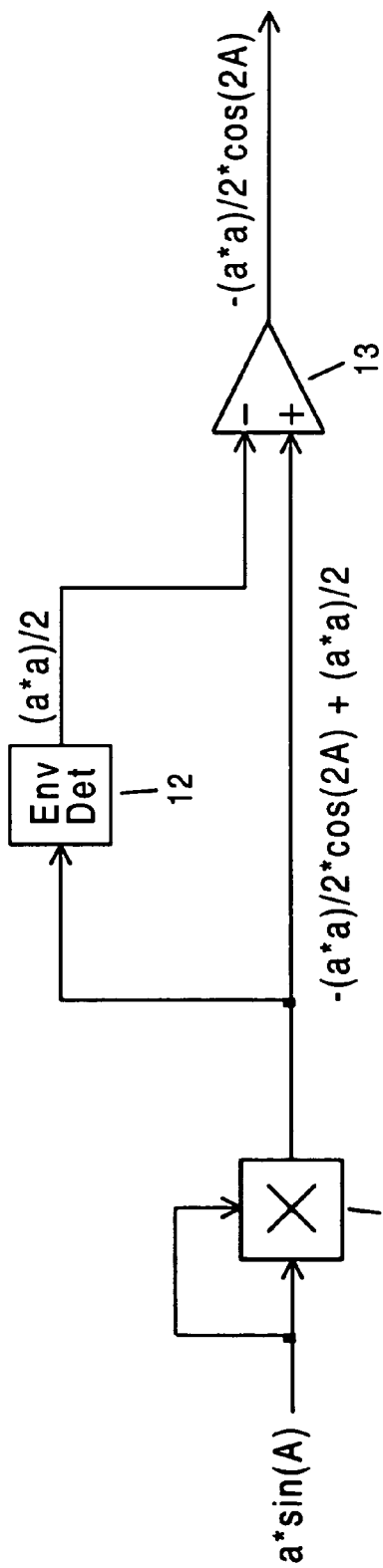
FIG. 3 shows a frequency doubler.

FIG. 3 is illustrative of the embodiment of a specific application of the present invention in which an input signal may be doubled in frequency, and which is responsive to signals which may vary over time in frequency and amplitude. An input signal a sin (A) is applied to both inputs of multiplier 11. The product evaluated by multiplier 11 is represented by the expression $(-a^2/2)\cos(2A)+(a^2/2)$. This signal is applied to the input of envelope detector 12, and to the non-inverting input of subtracter 13. Envelope detector 12 evaluates the magnitude of the signal applied to its input and thus provides a DC voltage $a^2/2$. The output signal from envelope detector 12 is applied to the inverting input of subtracter 13. Subtracter 13 thus evaluates the expression $(-a^2/2)\cos(2A)+(a^2/2)-(a^2/2)=(-a^2/2)\cos(2A)$. In this way, the circuit arrangement effectively produces the second harmonic of an input signal, and in novel fashion using DC coupling in the signal path, removes the dynamically varying DC term from the result of the multiplication process.

Figure 4:
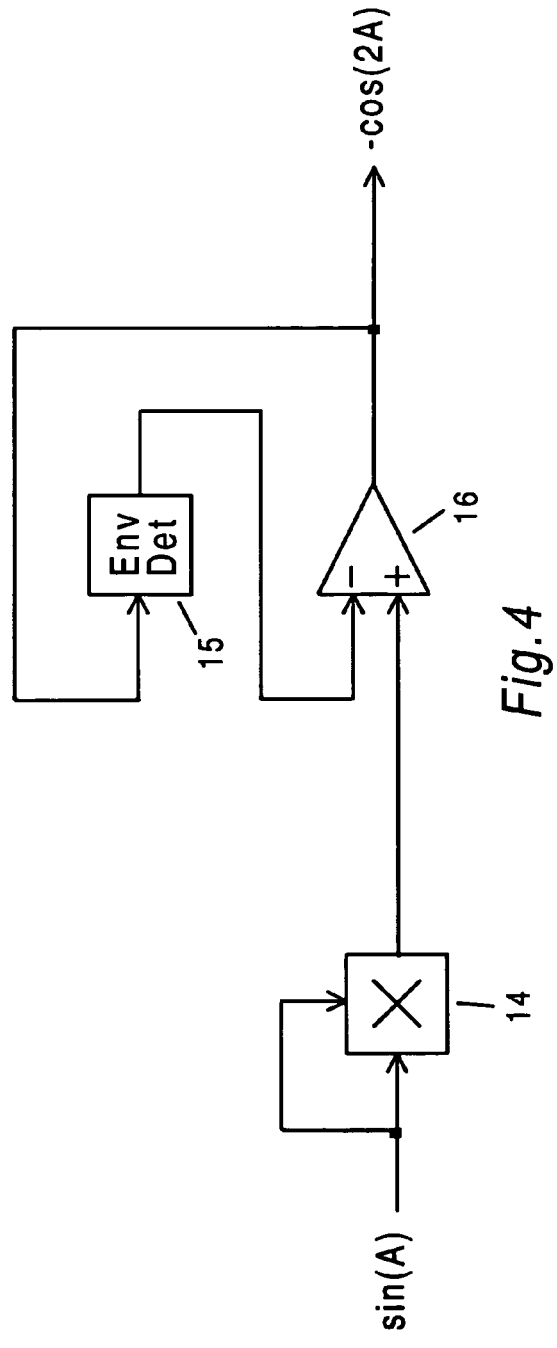
FIG. 4 shows an improved frequency doubler.

FIG. 4 shows a method by which the frequency doubler in FIG. 3 can be arranged to effectively shorten the dynamic response time of the circuit. The arrangement of the circuit in FIG. 4 is the same as the circuit in FIG. 3 as respects connections to multiplier 14 and subtracter 16 with the exception that the input of envelope detector 15 is instead coupled to the output of subtracter 16. Envelope detector 15 is in this way placed in the negative feedback loop of subtracter 16. This placement results in the realization of a significant reduction in the dynamic response time of the frequency doubler circuit. This preferred arrangement is utilized in FIG. 5.

Figure 5:
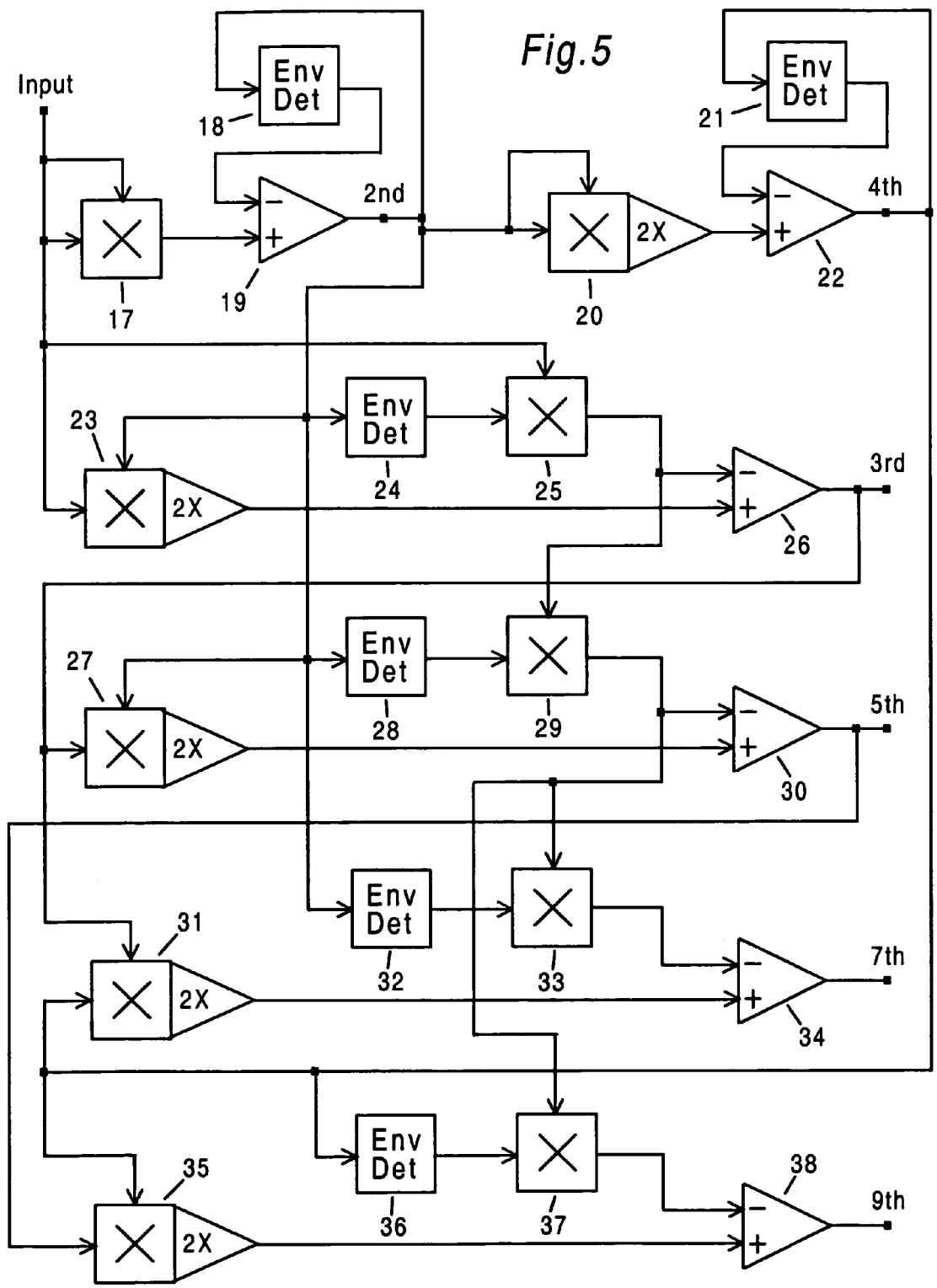
FIG. 5 shows a harmonics generator.

FIG. 5 illustrates an embodiment of the invention that utilizes a plurality of harmonic generating circuits which are cascaded in such a way as to produce a series of harmonics including the 2nd, 3rd, 4th, 5th, 7th, and 9th harmonic of an input signal. Beginning at the upper left of FIG. 5, an input signal a sin($\omega$t) is provided to both inputs of multiplier 17. Said multiplier finds the product $-(a^2/2)\cos(2\omega t)+a^2/2$ which is applied to the non-inverting input of subtracter 19. The output of subtracter 19 is applied to the input of envelope detector 18, which produces a DC voltage $a^2/2$. The output of envelope detector 18 is presented to the inverting input of subtractor 19, which by subtraction thus produces a 2nd harmonic $-(a^2/2)\cos(2\omega t)$.

The second harmonic is applied to both inputs of multiplier 20, which by applying a gain factor of 2 finds the resultant $(a^4/4)\cos(4\omega t)+a^4/4$. Envelope detector 21 evaluates the magnitude of this expression as a DC voltage $a^4/4$, which is presented to the inverting input of subtracter 22. The output of multiplier 20 is applied to the non-inverting input of subtracter 22, which evaluates the 4th harmonic signal $(a^4/4)\cos(4\omega t)$.

Input signal a sin($\omega$t) is also applied to a first input of multiplier 23. The 2nd harmonic $-(a^2/2)\cos(2\omega t)$, is applied to a second input of multiplier 23 which applies a gain factor of 2 and finds the resultant $-(a^3/2)\sin(3\omega t)+(a^3/2)\sin(\omega t)$. The 2nd harmonic signal is also applied to the input of envelope detector 24 which evaluates the magnitude of said 2nd harmonic as $a^2/2$. This resultant is provided to the first input of multiplier 25. The input signal a sin($\omega$t) is applied to the second input of multiplier 25 which evaluates the product as $(a^3/2)\sin(\omega t)$. This resultant is applied to the inverting input of subtracter 26. The output from multiplier 23 is applied to the non-inverting input of subtracter 26 which upon subtracting the terms at its inputs, produces a 3rd harmonic $-(a^3/2)\sin(3\omega t)$. The complete mathematical operation performed by this circuit is expressed as $2\cdot-(a^2/2)\cos(2\omega t)\cdot a \sin(\omega t)-((a^2/2)\cdot\sin(\omega t))$.

Still in reference to FIG. 5, a 5th harmonic generator circuit is realized by applying the 3rd harmonic signal to the first input of multiplier 27 and the 2nd harmonic signal to the second input of multiplier 27, wherein a gain factor of 2 is imposed. The product evaluated therein is represented as $(a^5/4)\sin(5\omega t)+(a^5/4)\sin(\omega t)$. The 2nd harmonic signal is also applied to the input of envelope detector 28 which evaluates the magnitude of said signal as a DC voltage $a^2/2$. This voltage is applied to a first input of multiplier 29. The signal from the output of multiplier 25, $(a^3/2)\sin(\omega t)$, is provided to a second input of multiplier 29 and hence the resultant $(a^5/4)\sin(\omega t)$ is evaluated at the output of multiplier 29. Said resultant signal is coupled to the non-inverting input of subtracter 30. The output of multiplier 27 is applied to the non-inverting input of subtracter 30 whereby a subtraction of the two input signals results in an expression for the 5th harmonic, $(a^5/4)\sin(5\omega t)$. The complete mathematical operation performed by this circuit is expressed as $2\cdot-(a^3/2)\sin(3\omega t)\cdot-(a^2/2)\cos(2\omega t)-((a^3/2)\cdot(a^2/2)\sin(\omega t))$.

For the generation of a 7th harmonic, the 4th harmonic signal is applied to a first input of multiplier 31 and the 3rd harmonic is applied to a second input of multiplier 31, whereby a gain factor of two is imposed. The resultant waveform appearing at the output of multiplier 31 is thus expressed as $-(a^7/8)\sin(7\omega t)+(a^7/8)\sin(\omega t)$. The 2nd harmonic signal is presented to the input of envelope detector 32 which evaluates the magnitude of the 2nd harmonic and presents at its output a DC voltage $a^2/2$. This voltage is applied to a first input of multiplier 33. A signal from the output of multiplier 29, $(a^5/4)\sin(\omega t)$, is applied to a second input of multiplier 33. Said multiplier evaluates the product of said signals at its respective inputs as $(a^7/8)\sin(\omega t)$. This waveform is presented to the inverting input of subtracter 34, and is subtracted from multiplier 31 output signal $-(a^7/8)\sin(7\omega t)+(a^7/8)\sin(\omega t)$ which appears at the non-inverting input of said subtracter. This operation yields as its result the expression for the 7th harmonic $-(a^7/8)\sin(7\omega t)$. The complete mathematical operation performed by this circuit is expressed as $2\cdot-(a^3/2)\sin(3\omega t)\cdot(a^4/4)\cos(4\omega t)-((a^2/2)\cdot(a^5/4)\sin(\omega t)$.

A 9th harmonic is generated by applying the 5th harmonic to a first input of multiplier 35 and the 4th harmonic to a second input of same said multiplier. A gain of 2 is imposed on the product evaluated at the output of multiplier 35 and is expressed as $(a^9/16)\sin(9\omega t)+(a^9/16)\sin(\omega t)$. The 4th harmonic is applied to the input of envelope detector 36 which evaluates the magnitude of the signal at said input and thus produces a DC voltage $a^4/4$. Said DC voltage is applied to a first input of multiplier 37. The output signal from multiplier 29, $(a^5/4)\sin(\omega t)$, is applied to a second input of multiplier 37. Said multiplier evaluates the product of the signals presented at its respective inputs as $(a^9/16)\sin(\omega t)$, and said signal is applied to the inverting input of subtracter 38. The output of multiplier 35 is coupled to the non-inverting input of subtracter 38 which subtracts the two signals at its respective inputs thus producing the resultant $(a^9/16)\sin(9\omega t)$. The complete mathematical operation performed by this circuit is expressed as $2\cdot(a^5/4)\sin(5\omega t)\cdot(a^4/4)\cos(4\omega t)-((a^4/4)\cdot(a^5/4)\sin(\omega t))$.

FIG. 5 is one possible arrangement for generating harmonics according to the present invention. It can be noted that the frequency difference between the two input multiplicands in each of the harmonic generator circuits shown in FIG. 5 is equal to the fundamental input frequency. This particular arrangement is presented by way of example because, due to the similarity of each of the individual generator circuits, the apparatus can be constructed from identical circuit modules. However, for persons skilled in the art, other arrangements may be foreseen. For example a 5th harmonic may be derived from the sum of the fundamental frequency and the 4th harmonic. Similarly, a 7th harmonic may be obtained from the sum of the 2nd and 5th harmonics. This invention is inclusive of any similar such modifications to the arrangements described herein.

Additional simplification of the apparatus may be enjoyed by the elimination of certain redundant circuits by for example making use of a single envelope detector for evaluating the magnitude of the 2nd harmonic generator circuit. Additional higher order harmonics may also be generated by simple extrapolation of this method. Such varied arrangements are available to persons skilled in the art and are anticipated by the present invention.

It may also be desirable to emphasize or de-emphasize certain frequency ranges using frequency responsive means either before or after harmonics are generated. In addition, it may be desirable to effect non-linear changes to the dynamic characteristics of signals applied to the input of the apparatus, or to effect non-linear changes to the dynamic levels of signals at the output of the harmonics generator circuits. By generating harmonics in this way, by combining them with a fundamental frequency, and by controlling the phase and magnitude of each of the harmonics, the apparatus affords a user the ability to precisely control the shape of the resulting waveform, thus facilitating this unique approach to analog signal processing. Such applications are by other means common in practice and are anticipated by the present invention.

Figure 6:
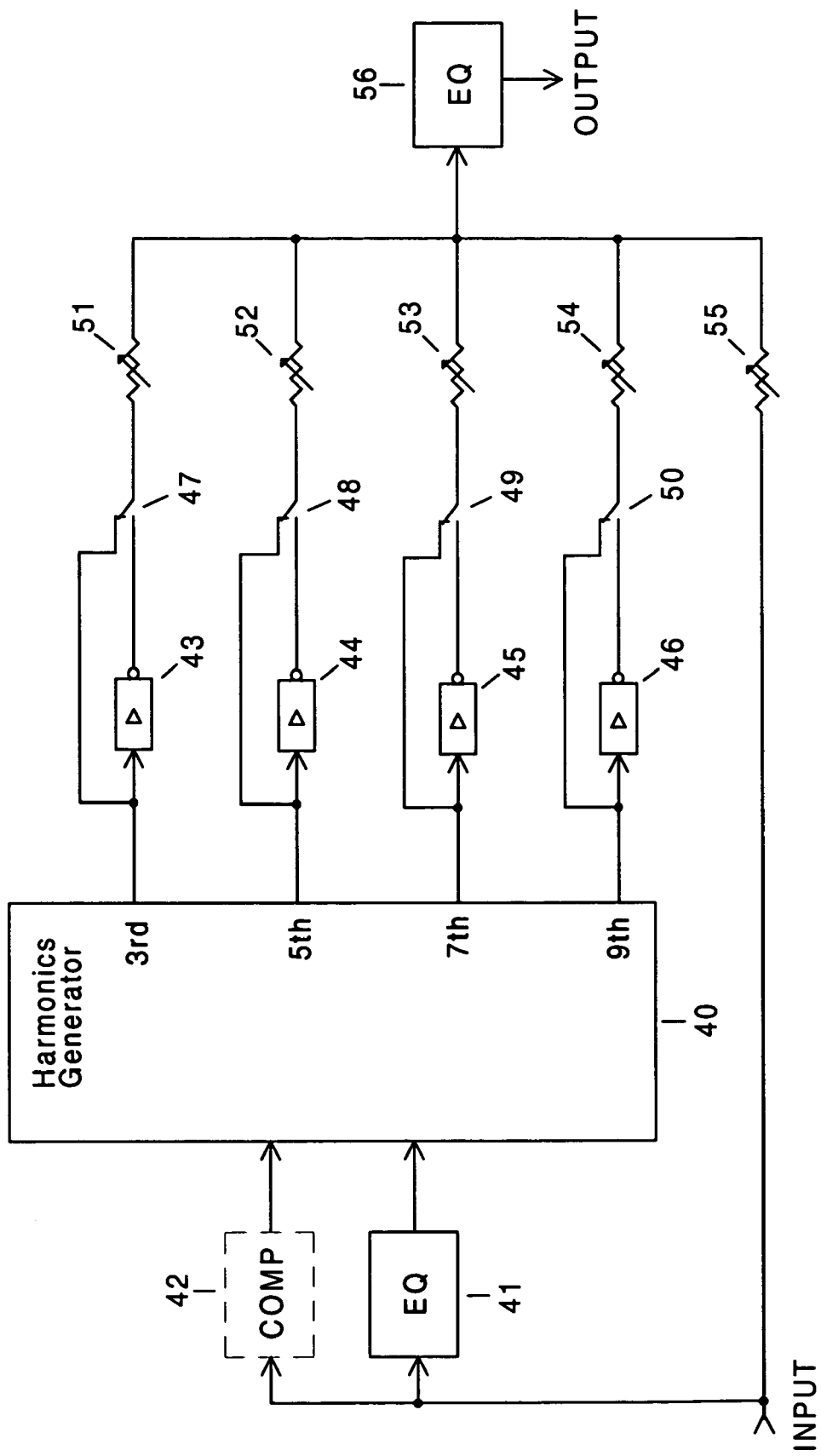
FIG. 6 shows the incorporation of a harmonics generator into a signal processing apparatus.

FIG. 6 illustrates by way of example an embodiment of a signal processing apparatus which incorporates into the present invention the applications described in the preceding paragraph. An odd harmonics generator 40 in accord with the invention is shown interconnected at its input with a first frequency responsive equalizer network 41. Said equalizer modifies the frequency response of input signals, either to emphasize or de-emphasize one or more bands of frequencies prior to the generation of harmonics. In this way, the amplitudes of the formants of the harmonic series generated by harmonics generator 40 will vary by frequency in proportion to the frequency response envelope of equalization network 41. Shown alternatively at the input of harmonics generator 40 is compression circuit 42. This circuit responds dynamically to the input signal level and has a non-linear gain element which at its output, compresses the amplitude range of signals. Such a circuit allows the harmonics generator to maintain a more uniform set of harmonics in response to a wide range of input signal levels. The illustration in FIG. 6 shows a simple example of how a compression circuit could be arranged, but other arrangements are also common in the art. The several outputs of harmonics generator 40 are coupled respectively to inverters 43–46 and also to a first set of terminals of the SPDT switches 47–50. The outputs of inverters 43–46 are coupled to a second set of terminals of the SPDT switches 47–50. This arrangement allows for each of the separate signals from the output of harmonics generator 40 to either be inverted or non-inverted, depending on the individual settings of switches 47–50. The common pole of each of the SPDT switches 47–50 is coupled respectively to potentiometers 51–54. Said potentiometers thus allow for the selective attenuation of each of the harmonics. Potentiometer 55 is coupled on one side to the input of the apparatus thus providing means of adjustment to the level of the fundamental signal. The output sides of potentiometers 51–55 are coupled together in a summing network, at which point a composite waveform is formed comprising the several harmonics and the fundamental. Said summing network of potentiometers 51–55 is coupled to the input of a second frequency responsive equalizer network 56. This second equalizer provides an adjustable means for enveloping the spectral response of the apparatus in proportion to, and as a function of the frequency response envelope of said equalizer network 56. The example illustrated in FIG. 6 and described in the accompanying text is provided to suggest one of many possible arrangements in which the invention may be utilized by persons skilled in the relevant art, and is not intended to limit the scope of this invention.

What I claim as my invention is:

1. A circuit arrangement for multiplying signals comprising:
   a first multiplier, having an output, having a first input for receiving a first input signal, and having a second input for receiving a second input signal;
   a first envelope detector having an output and having an input for receiving the first input signal;
   a second envelope detector having an output and having an input for receiving the second input signal;
   a second multiplier, having a first input, a second input, and an output, wherein the output of said first envelope detector is coupled to the first input of said second multiplier, and the output of said second envelope detector is coupled to the second input of said second multiplier;
   a third multiplier, having a first input, a second input, and an output, wherein the output of said second multiplier is coupled to a first input of said third multiplier, and the second input of said third multiplier is configured to receive a third input signal, the third input signal at a frequency which is a difference between a frequency of the first input signal and a frequency of the second input signal; and
   a subtracter for providing an output signal, whereby a signal from the output of said third multiplier device is subtracted from the output of said first multiplier.

2. The circuit arrangement according to claim 1 wherein the first multiplier, the envelope detectors, the second multiplier, the third multiplier, and the subtracter constitute a harmonic generator circuit.

3. A circuit arrangement for multiplying signals comprising:
   a first multiplier, having a first input for receiving a first input signal, having a second input for receiving a second input signal, and having an output;
   an envelope detector having an output and having an input for receiving said second input signal;
   a second multiplier, having a first input, a second input, and an output, wherein the output of said envelope detector is coupled to the first input of said second multiplier, and a signal representing the difference between a frequency of said first input signal and a frequency of said second input signal is applied to the second input of said second multiplier;
   and a subtracter, having an output for providing an output signal, whereby a signal produced at the output of said second multiplier is subtracted from a signal produced at the output of said first multiplier.

4. The circuit arrangement according to claim 3 wherein the first multiplier, the envelope detector, the second multiplier, and the subtracter constitute a harmonic generator circuit.

5. A frequency doubler circuit comprising:
   a multiplier, having a first input, a second input, and an output wherein a signal is applied to the first input and to the second input of said multiplier;
   an envelope detector having an output and having an input for receiving an output signal from said multiplier;
   and a subtracter having an input, and having an output for providing an output signal, whereby a signal produced at the output of said envelope detector is subtracted from a signal produced at the output of said multiplier.

6. A frequency doubler circuit comprising:
   a multiplier, having a first input, a second input, and an output, wherein a signal is applied to the first input and to the second input of said multiplier;

an envelope detector having an output and having an input for receiving an output signal from a subtracter;

said subtracter having an input and having an output for providing an output signal, whereby a signal produced at the output of said envelope detector is subtracted from a signal produced at the output of said multiplier.

7. A harmonics generator which includes the circuit according to claim 6.

8. A harmonics generator circuit comprising:

a means for accepting a fundamental input signal;

a second harmonic generator comprising a multiplier, an envelope detector, and a subtracter, each having input and output means, wherein the fundamental signal is applied to both inputs of the multiplier; the output from said multiplier being applied to the input of the envelope detector; and wherein a signal produced at the output of said envelope detector is subtracted from a signal produced at the output of said multiplier;

a third harmonic generator comprising a first multiplier, a second multiplier, an envelope detector, and a subtracter, each having input and output means, wherein a fundamental signal is applied to a first input of the first multiplier, a second harmonic signal is applied to a second input of said multiplier, same said second harmonic signal is applied to the input of said envelope detector, the output of said envelope detector is coupled to a first input of the second multiplier, said fundamental signal is applied to a second input of said second multiplier, and the subtracter provides an output signal whereby a signal produced at the output of said second multiplier is subtracted from a signal produced at the output of said first multiplier;

a fourth harmonic generator comprising a multiplier, an envelope detector, and a subtracter, each having input and output means, wherein a second harmonic signal is applied to inputs of the multiplier, an output signal from said multiplier is applied to the input of the envelope detector, and a signal produced at the output of said envelope detector is subtracted from a signal produced at the output of said multiplier;

a fifth harmonic generator comprising a first multiplier, a second multiplier, an envelope detector, and a subtracter, each having input and output means, wherein a third harmonic signal is applied to a first input of the first multiplier; a second harmonic signal is applied to a second input of said first multiplier; same said second harmonic signal is applied to the input of the envelope detector, the output of said envelope detector is coupled to a first input of the second multiplier, a signal produced at the output of the second multiplier in said third harmonic generator is applied to a second input of said second multiplier in said fifth harmonic generator, and the subtracter provides an output signal whereby a signal produced at the output of said second multiplier is subtracted from a signal produced at the output of said first multiplier;

a seventh harmonic generator circuit comprising a first multiplier, a second multiplier, an envelope detector, and a subtracter, each having input and output means, wherein a fourth harmonic signal is applied to a first input of the first multiplier, a third harmonic signal is applied to a second input of said first multiplier; a second harmonic signal is applied to the input of the envelope detector, the output of which is coupled to a first input of the second multiplier, a signal produced at the output of the second multiplier in said fifth harmonic generator is applied to a second input of the second multiplier in said seventh harmonic generator; and the subtracter provides an output signal whereby a signal produced at the output of said second multiplier is subtracted from a signal produced at the output of said first multiplier;

and a ninth harmonic generator circuit comprising a first multiplier, a second multiplier, an envelope detector, and a subtracter, each having input and output means, wherein a fifth harmonic signal is applied to a first input of said first multiplier; a fourth harmonic signal is applied to a second input of said first multiplier and to the input of the envelope detector, an output of the envelope detector is applied to a first input of the second multiplier, a signal produced at the output of the second multiplier in said fifth harmonic generator is applied to a second input of the second multiplier in said ninth harmonic generator circuit, and a subtracter provides an output signal whereby a signal produced at the output of said second multiplier is subtracted from a signal produced at the output of said first multiplier.

9. A harmonics generator according to claim 8 having circuit elements for adjusting the phase and/or amplitude of each harmonic individually, and having circuit elements for combining individual harmonic and fundamental signals.

10. A harmonics generator according to claim 8 having harmonic generating circuitry for providing additional higher even and/or odd order harmonics.

11. A harmonics generator according to claim 9 with frequency response adjustment circuitry at its input.

12. A harmonics generator according to claim 9 with frequency response adjustment circuitry at its output.

13. A harmonics generator according to claim 9 with amplitude responsive, gain controlling circuitry at its input.

* * * * *